(12) United States Patent
Mari Curbelo et al.

(10) Patent No.: US 12,087,699 B2
(45) Date of Patent: Sep. 10, 2024

(54) SEMICONDUCTOR MODULE

(71) Applicant: Danfoss Silicon Power GmbH, Flensburg (DE)

(72) Inventors: Alvaro Jorge Mari Curbelo, Nordborg (DK); Tobias Schütz, Nordborg (DK); Robert Rösner, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 336 days.

(21) Appl. No.: 17/609,885

(22) PCT Filed: Apr. 22, 2020

(86) PCT No.: PCT/EP2020/061179
§ 371 (c)(1),
(2) Date: Nov. 9, 2021

(87) PCT Pub. No.: WO2020/229113
PCT Pub. Date: Nov. 19, 2020

(65) Prior Publication Data
US 2022/0216157 A1    Jul. 7, 2022

(30) Foreign Application Priority Data
May 16, 2019 (DE) .......................... 102019112936.2

(51) Int. Cl.
*H01L 23/498* (2006.01)
*H01L 23/538* (2006.01)
(Continued)

(52) U.S. Cl.
CPC ........ *H01L 23/5386* (2013.01); *H01L 25/072* (2013.01); *H01L 23/49811* (2013.01);
(Continued)

(58) Field of Classification Search
CPC ............... H01L 23/5386; H01L 25/072; H01L 23/49811; H01L 24/48; H01L 24/49;
(Continued)

(56) References Cited

U.S. PATENT DOCUMENTS

| 5,539,232 | A  | 7/1996 | Nakanishi et al. |
| 6,939,743 | B2 | 9/2005 | Frey |

(Continued)

FOREIGN PATENT DOCUMENTS

| DE | 112013001234 T5 | 1/2015 |
| DE | 102016117248 B4 | 7/2019 |

(Continued)

OTHER PUBLICATIONS

International Search Report for PCT/EP2020/063045 Dated Jun. 15, 2020.

(Continued)

*Primary Examiner* — Elias Ullah
(74) *Attorney, Agent, or Firm* — McCormick, Paulding & Huber PLLC

(57) ABSTRACT

A power module (1) providing a half bridge, the power module including: at least one substrate (2) including an inner load track (3), two intermediate load tracks (4) and two outer load tracks (5), each of which load tracks is elongated and extends substantially across the at least one substrate (2) in a first direction (6); wherein the two intermediate load tracks (4) are arranged adjacent to the inner load track (3), and each outer load track (5) is arranged on the opposite side of one of the two intermediate load tracks (4) with respect to a second direction (7) substantially orthogonal to the first direction (6).

20 Claims, 4 Drawing Sheets

(51) Int. Cl.
   *H01L 25/07*   (2006.01)
   *H01L 23/00*   (2006.01)
   *H02M 7/00*    (2006.01)
   *H02M 7/537*   (2006.01)
(52) U.S. Cl.
   CPC .............. *H01L 24/48* (2013.01); *H01L 24/49* (2013.01); *H01L 2224/48225* (2013.01); *H01L 2224/49175* (2013.01); *H02M 7/003* (2013.01); *H02M 7/537* (2013.01)
(58) Field of Classification Search
   CPC . H01L 2224/48225; H01L 2224/49175; H01L 24/05; H01L 24/06; H01L 24/29; H01L 24/32; H01L 2224/04042; H01L 2224/05553; H01L 2224/0603; H01L 2224/291; H01L 2224/32227; H01L 2224/45124; H01L 2224/48227; H01L 2224/4903; H01L 2224/49111; H01L 2224/8384; H01L 23/3735; H01L 25/18; H02M 7/003; H02M 7/537
   See application file for complete search history.

(56) References Cited

U.S. PATENT DOCUMENTS

| | | | |
|---|---|---|---|
| 7,342,262 B2 | 3/2008 | Frey | |
| 8,300,443 B2 | 10/2012 | Takizawa | |
| 9,899,283 B2 | 2/2018 | Cottet et al. | |
| 11,532,600 B2 | 12/2022 | Mari Curbelo et al. | |
| 2011/0242866 A1 | 10/2011 | Takizawa | |
| 2016/0172995 A1 | 6/2016 | Obiraki et al. | |
| 2017/0148710 A1* | 5/2017 | Steigler | H01L 23/3735 |
| 2017/0338162 A1 | 11/2017 | Cottet et al. | |
| 2019/0140557 A1 | 5/2019 | Zhang et al. | |
| 2019/0149064 A1 | 5/2019 | Lefevre | |
| 2019/0304946 A1 | 10/2019 | Cottet et al. | |
| 2020/0066686 A1 | 2/2020 | Mohn et al. | |

FOREIGN PATENT DOCUMENTS

| | | |
|---|---|---|
| EP | 0578108 B1 | 1/1994 |
| EP | 2996233 A1 | 3/2016 |
| EP | 3246945 A1 | 11/2017 |
| EP | 3484038 A1 | 5/2019 |
| JP | 3705755 B2 | 10/2005 |
| WO | 2018130409 A1 | 7/2018 |
| WO | 2018202620 A1 | 11/2018 |

OTHER PUBLICATIONS

International Search Report for PCT/EP2020/061179 Dated Jun. 9, 2020.

Zhu, N., et al, "Substrate Layout Evaluation for T-type Three-level IGBT Modules", IEEE (2014), pp. 4677-4684 (Year: 2014).

* cited by examiner

SEMICONDUCTOR MODULE

CROSS-REFERENCE TO RELATED APPLICATION

This application is a National Stage application of International Patent Application No. PCT/EP2020/061179, filed on Apr. 22, 2020, which claims priority to German Application No. 102019112936.2 filed on May 16, 2019, each of which is hereby incorporated by reference in its entirety.

TECHNICAL FIELD

Semiconductor power modules are widely used in industry. For example, such a power module may be used for the controlled switching of high currents and can be used in power converters (such as inverters) to convert DC to AC or vice versa, or for converting between different voltages or frequencies of AC. Such inverters are used in motor controllers or interfaces between power generation or storage, or a power distribution grid.

BACKGROUND

The semiconductor power module is designed to fulfill two major characteristics: High power conversion efficiency and high power density. Factors as lifetime, cost and quality are also taken into account. In order to achieve high power density, high performance wide-bandgap semiconductors, such as Silicon Carbide (SiC) semiconductor switches may be used, as they generally outperform standard silicon based semiconductor switches, i.e. Insulated Gate Bipolar Transistors (IGBT). SiC devices put high demands on the design of the power module from thermal and electrical standpoint. The wide-bandgap semiconductors (e.g., SiC semiconductor switches) have the characteristic that they switch very fast, meaning that the transition from conduction to blocking mode takes only a few nanoseconds.

Fast switching in electronic circuits, in combination with stray inductances, causes voltage overshoots when such semiconductor power modules are use. These voltage overshoots increase switching losses, and may cause EMI emissions through ringing. As current gradients during switching are high, the stray/parasitic inductance of the whole assembly needs to be as small as possible.

SiC MOSFETs are used as the semiconductor switches in applications where highest efficiency in small building volume is required by the application. SiC MOSFETs show fast switching speeds and low on-state resistance at the same time. Since SiC wafers are expensive to manufacture, and with current manufacturing processes it is hard to fabricate components with an acceptably low crystal failure amount, the die are typically very small (for example, 5-25 $mm^2$). This keeps yield losses low, but restricts the total current that a SiC semiconductor switches can pass. In order to achieve high output powers, several of these small semiconductor switches (for example MOSFETs) need to be operated in parallel. In applications such as automotive power conversion, the use of multiple semiconductor switches in parallel takes up space within the semiconductor power module, yielding potentially larger modules. However, space is at a premium within a vehicle, and increasing the size of modules is not generally an option. It is therefore a great advantage if innovative design of layouts can both accommodate multiple semiconductor switches in parallel, a balanced (symmetric) operation, low stray inductance and small overall layout size.

SUMMARY

It is, thus, an object of the present invention to provide a power module which is capable of exhibiting the simultaneous switching and balanced operation of multiple semiconductor switches in parallel, lower stray inductances, and more stable and efficient operation than currently available power modules.

According to a first aspect of the present invention the above and other objects are fulfilled by providing a power module providing a half bridge, the power module comprising at least one substrate comprising an inner load track, two intermediate load tracks and two outer load tracks, each of which load tracks is elongated and extends substantially across the at least one substrate in a first direction. The two intermediate load tracks are arranged adjacent to the inner load track, and each outer load track is arranged on the opposite side of one of the two intermediate load tracks with respect to a second direction substantially orthogonal to the first direction. The power module also comprises two first sets of semiconductor switches, each first set of semiconductor switches being mounted on the inner load track and electrically connected to the an intermediate load track, such that the first sets of semiconductor switches form a first arm of the half bridge. In addition, the power module comprises two second sets of semiconductor switches, each second set of semiconductor switches being mounted on an intermediate load track and electrically connected to an outer load track, such that the second sets of semiconductor switches form a second arm of the half bridge.

The substrate may comprise an insulating base, with conducting tracks to form the circuitry required attached to the insulating base. A suitable substrate may be a DBC (direct bonded copper) substrate formed of two conducting copper layers either side of an insulating ceramic layer. Other suitable substrates may include DBA (direct bonded aluminum) or other substrates well known in the field.

The term "track" is here used to specify a circuit track formed from a metal layer forming part of the substrate and insulated from other tracks by a gap. Such tracks conduct electrical current and may be used to form the circuitry which enables the semiconductor switches to control the current which flows through the semiconductor power module when in service. Tracks may be used to conduct the switched currents themselves, or to conduct the control signals, such as gate signals, which control the switching of the semiconductor switches. Alternatively, tracks may be used to conduct signals used for sensing parameters such as temperatures or voltages in different parts of the semiconductor switching module. The different usages of tracks require different track characteristics, for example their resistance to current flow, or their mutual inductance, and the physical construction of the tracks and/or their routings may take account of this. The term "load track" is here used to specify a track suitable for carrying a large current, such as that supplying the electrical load for which the power module is supplying power. Suitability for large currents may be a combination of the width of the track and thickness of the track, forming a large cross-sectional area and thus allowing the passage of large currents without undue heating. Other tracks, not load tracks, with smaller cross-sections, may be suitable for passing control or sensing signals.

The term "semiconductor switches" is here used to include any of a number of known semiconductor switching devices. Examples of such devices are Thyristors, JFETs, IGBTs and MOSFETs, and they may be based on traditional silicon technology or wide band-gap technologies such as silicon carbide (SiC).

The term "mounted" is here used to mean the permanent connection of a device to a track, and may include an electrically conducting connection. Means of such connections include soldering, brazing and sintering.

The term "electrically connected to" is here used to mean the connection of part of the device to a remote track or other device. Traditionally this form of connections made using metallic wirebonds comprising aluminum. However, other metals such as copper may be usable. The term also covers the use of ribbon or tape bonds, braided tapes and the use of solid metal structures such as clips or busbars.

The term "adjacent" is here used to denote the close proximity of load tracks to each other. The term "adjacent", when used with reference to load tracks does not exclude the presence of other forms of track, such as control or sensing signal tracks, between the load tracks. Two load tracks are still described in this document as "adjacent" to each other when they are separated by an insulating gap, or by control or sensing signal tracks, but not by other load tracks.

The layout of the load tracks may be symmetric about a line extending in the first direction.

Gate connections to the semiconductor switches comprising the first and second set of semiconductor switches may be made via gate tracks arranged between the intermediate load tracks and the inner load track.

Alternatively, or additionally, such gate connections may be made via gate tracks arranged between the intermediate load tracks and the outer load tracks.

Again alternatively, or additionally, such gate connections may be made via gate tracks arranged on the opposite side of the outer load tracks to the intermediate load tracks.

In one embodiment, the gate tracks extend substantially across the at least one substrate in the first direction.

In another embodiment, the source-sense connections to the semiconductor switches comprising the first and second set of semiconductor switches are made from source-sense tracks arranged between the intermediate load tracks and the inner load track. Such source-sense connections, also known as Kelvin connections, and are used to enable measurement directly of the potential at the semiconductor itself, and prevent the load current coupling to the gate drive circuit. This helps to avoid any resistive and/or inductive coupling effects with the load current.

The source-sense connections to the semiconductor switches comprising the first and second set of semiconductor switches may additionally or alternatively be made via source-sense tracks arranged between the intermediate load tracks and the outer load tracks, or via source-sense tracks arranged on the opposite side of the outer load tracks to the intermediate load tracks.

The source-sense connections and/or the gate connections to the semiconductor switches comprising the second set of semiconductor switches may additionally or alternatively be made via tracks arranged between the outer load tracks and the edge of the substrate.

In an embodiment, the source-sense tracks extend substantially across the at least one substrate in the first direction.

In an alternative embodiment the gate and Kelvin source connections extend vertically to the top side of the power module package.

In a preferred embodiment, the external DC power terminals are arranged at one end of the module in the first direction, and one or more AC power terminals are arranged at the opposite end of the module in the first direction.

In an alternative embodiment one or more of the gate connections may be electrically connected to terminals placed on the external surface of the power module, extending substantially orthogonally to the plane of the substrate. In such an embodiment, the gate control signals may be lead into the power module through "top contact" terminals. Such an arrangement minimizes lengths of conductors between a driving circuit outside the module and the semiconductor switches themselves. This is a great advantage in reducing stray-inductances.

In an alternative embodiment one or more of the source-sense connections may be electrically connected to terminals placed on the external surface of the power module, extending substantially orthogonally to the plane of the substrate. Such an arrangement minimizes lengths of conductors between the semiconductor switches and the measurement circuits of driver circuits and thus may help to avoid any inductive coupling effects with the load current.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings.

DETAILED DESCRIPTION

Figure 1:
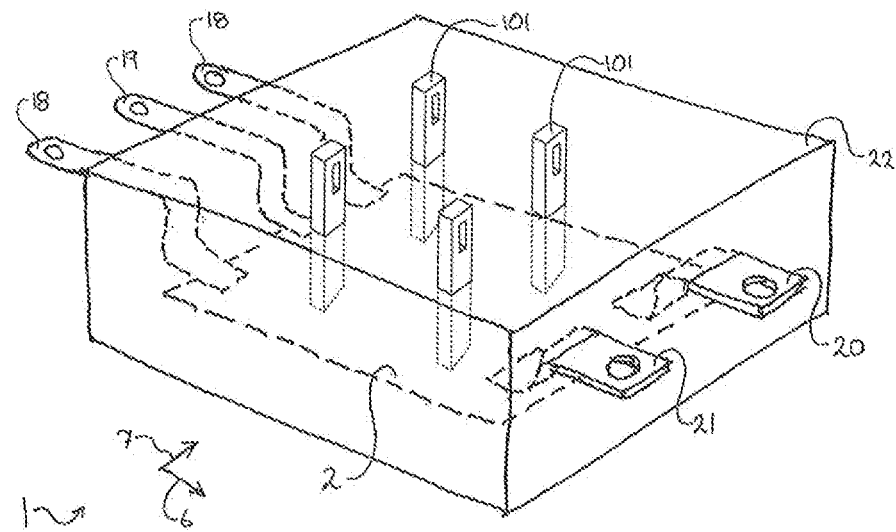
FIG. 1 shows a perspective view of a first embodiment of the inventive power module.

Referring now in detail to the drawings for the purpose of illustrating preferred embodiments of the present invention, a first embodiment of the inventive power module 1 is shown in FIG. 1. The power module 1 shown comprises a substrate 2 within the body of the power module. The power module 1 is designed to provide a half bridge circuit, and to this end three DC power terminals are provided 18, 19 and two AC power terminals 20, 21 at the opposite end of the packaging. The substrate 2, and circuitry connected to it, together with the internal sections of the power terminals 18, 19, 20, 21 are, in this embodiment, encapsulated in a mold compound 22. Alternative embodiments are possible where the substrate is attached to a baseplate and/or mounted within a frame which is subsequently filled with silicone gel and completed with a lid. In addition, it is also possible to mount several substrates within a single package to provide a power module containing several half bridges. One or more terminals 101 for the connection of gate and/or source-sense signals are placed on the external surface of the power module, extending substantially orthogonally to the plane of the substrate 2.

Figure 2:
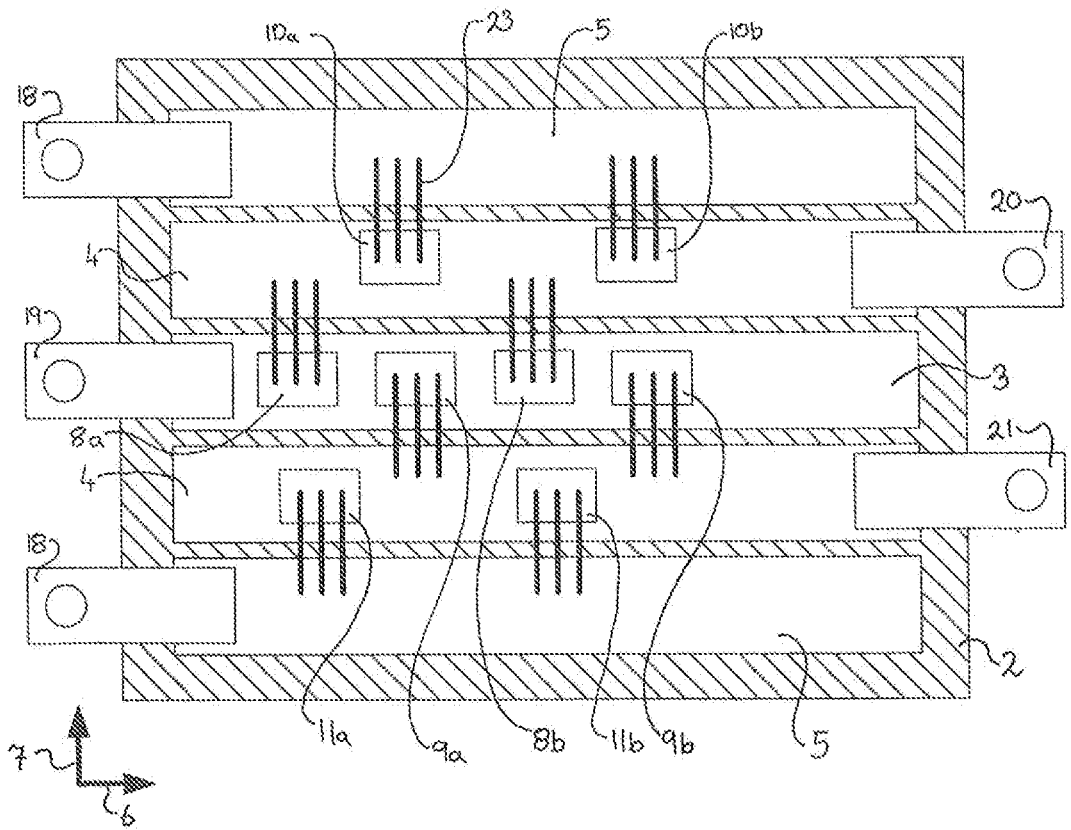
FIG. 2 shows a plan view of an embodiment of the substrate 2 which forms part of the power module 1 shown in FIG. 1.

FIG. 2 shows an embodiment of the substrate 2 which forms part of the power module 1 shown in FIG. 1. The substrate may be, for example, a DCB (direct copper bonded) substrate comprising a central ceramic layer acting as an insulator, and clad on both sides with a copper layer. In some embodiments the lower copper layer is left complete, whilst the upper copper layer is etched to form a number of separate conducting tracks which form the required circuits. Onto the tracks are mounted components such as semiconductor switches. In the embodiment shown in FIG. 2 there are five conducting tracks each of which extend substantially across the substrate in a first direction 6. The tracks comprise an inner load track 3, two intermediate load tracks and two outer load tracks 5. The two outer load tracks are connected to DC power terminals 18 and the inner load track 3 is connected to a DC load terminal 19. The two intermediate load tracks for are connected to the AC power terminals 20, 21 respectively.

In FIG. 2 are also shown semiconductor switches. In this embodiment the semiconductor switches comprise SiC (silicon carbide) MOSFETs. The use of other types of vertical structure semiconductor switches is also possible, for example IGBTs.

There are two first sets of semiconductor switches; 8a and 8b being one, and 9a and 9b the other. Both of these sets are mounted on the inner load track 3 by soldering, sintering or by other connection technologies known in the field. They are also electrically connected from contact surfaces opposite the contact surfaces used for making contact with the inner load track 3 to one of the intermediate load tracks 4. Semiconductors 8a and 8b are connected via wirebonds 23 to the top intermediate load track 4 (connected to AC power terminal 20), and semiconductors 9a and 9b connected via wirebonds 23 to the lower intermediate load track 4 (connected to AC power terminal 21). These are first sets of semiconductor switches form a first arm of the half bridge circuit.

There are two second sets of semiconductor switches; 10a and 10b being one, and 11a and 11b the other. Both of these sets are mounted on one of the intermediate load tracks 4 by soldering, sintering or by other connection technologies known in the field.

They are also electrically connected from contact surfaces opposite the contact surfaces used for making contact with an intermediate load track 4 to one of the outer load tracks 5.

Semiconductors 10a and 10b are connected via wirebonds 23 to the top outer load track 5 (connected to DC power terminal 18), and semiconductors 11a and 11b connected via wirebonds 23 to the lower outer load track 5 (connected to DC power terminal 18). These second sets of semiconductor switches form a second arm of the half bridge circuit.

The intermediate tracks 4 may be connected to a single AC terminal 20 extending to the outside of the package in an alternative embodiment.

Each set of semiconductor switches described above may consist of more than two semiconductor chips.

Figure 3:
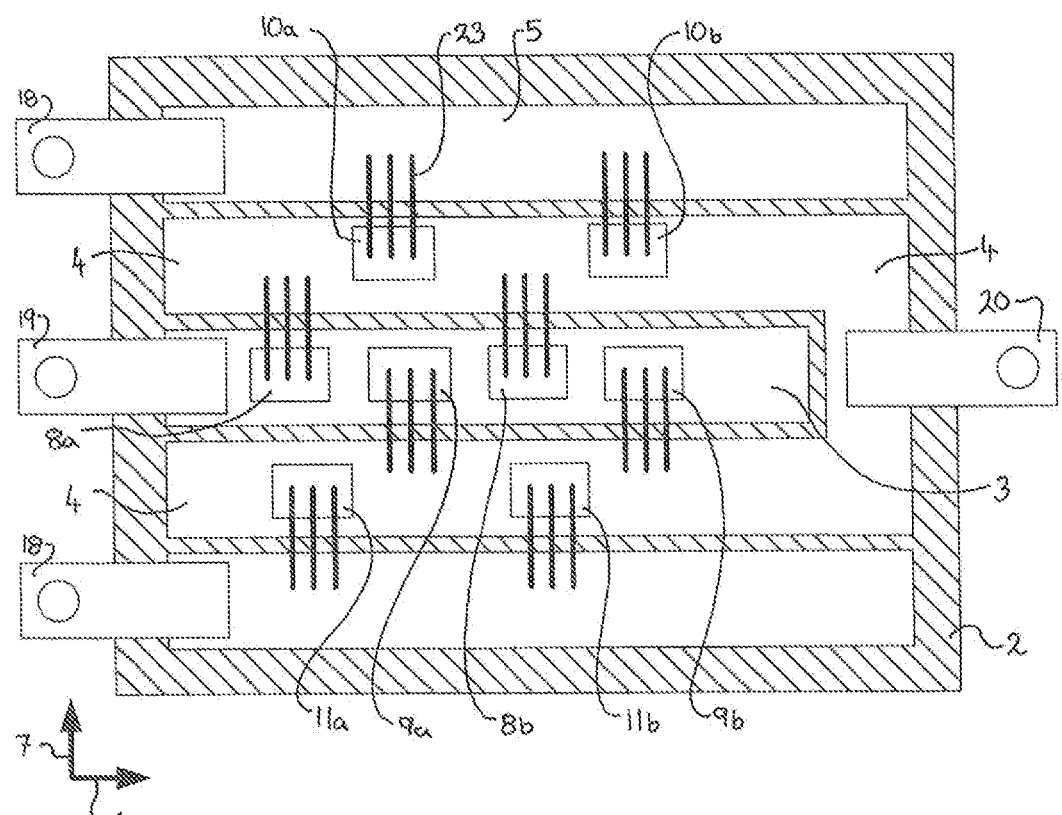
FIG. 3 shows a plan view of an alternative embodiment of the substrate layout shown in FIG. 2.

FIG. 3 illustrates an alternative embodiment of the substrate layout shown in FIG. 2. The significant difference between these two embodiments is that the end of the two intermediate load tracks 4 shown on the right side of FIG. 2 are connected together by a cross track area, and a single AC power terminal 20 replaces the two terminals shown in FIG. 2.

Figure 4:
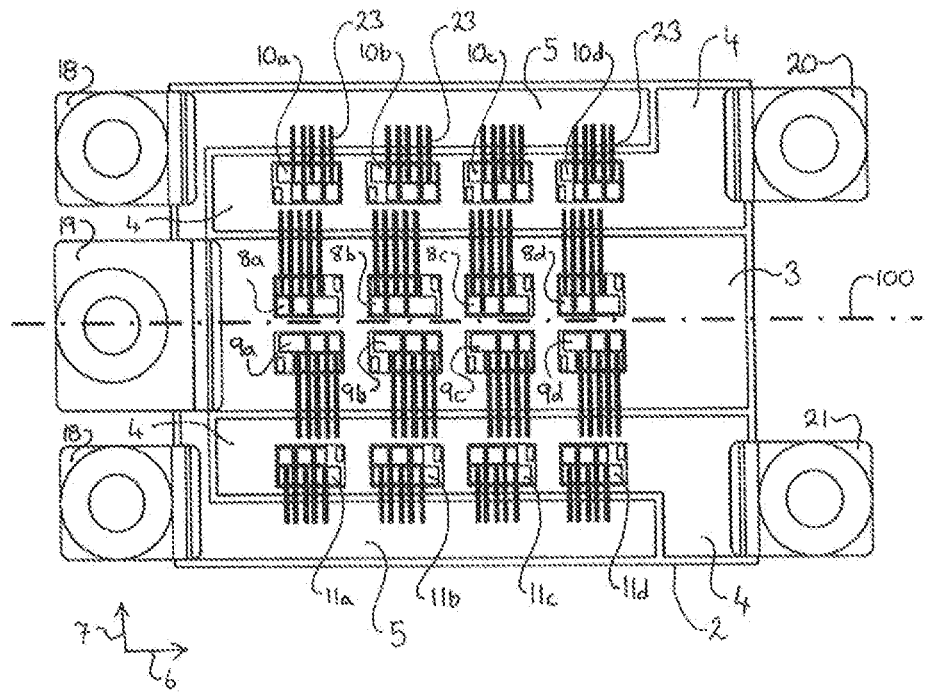
FIG. 4 shows a plan view of another embodiment of the substrate of the inventive power module 1.

FIG. 4 shows another embodiment of the substrate of the inventive power module 1. Here, the layout is topologically similar to that shown in FIG. 2, but the details of shapes of load tracks 3, 4, 5 are different. In addition, there are twice as many semiconductors, but these are still divided up into two first sets (8a-8d and 9a-9d) and two second sets (10a-10d and 11a-11d). Also shown in FIG. 4 is a layout of load tracks 3, 4, 5 which is symmetric about a line 100 extending in the first direction 6.

Figure 5:
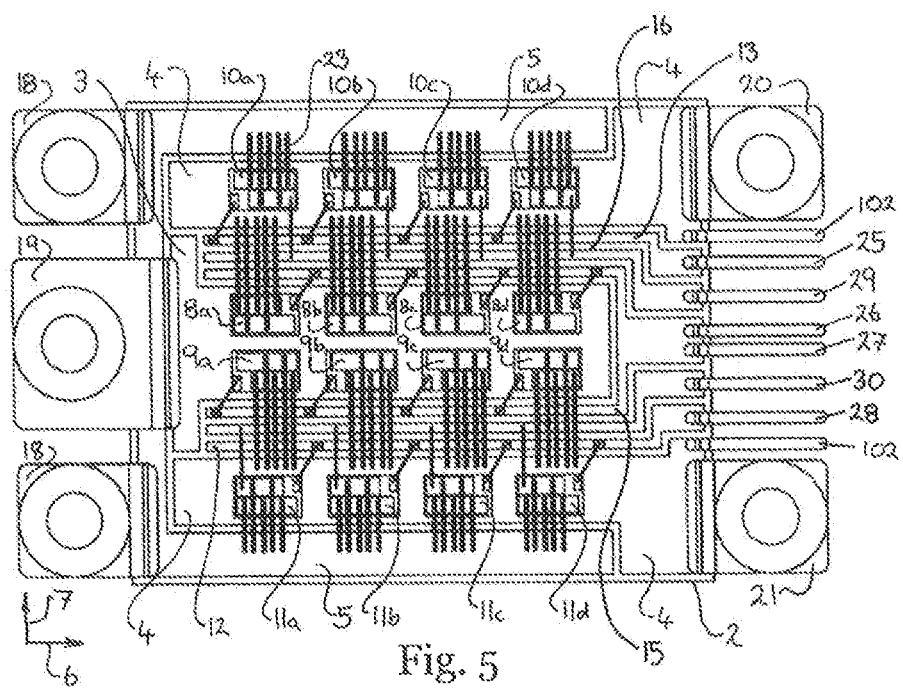
FIG. 5 shows a plan view of another embodiment of the substrate of the inventive power module 1.

FIG. 5 illustrates another embodiment of the substrate of the inventive power module 1. Here the layout of the load tracks 3, 4, 5 is similar to that shown in FIG. 4, but gate tracks 12, 13, 14, 15 and source-sense tracks 16, 17 are also shown. The gate tracks 12, 13, 14, 15 are connected to gate terminals 25, 26, 27, 28. The source-sense tracks 16, 17 are connected to the source-sense terminals 29, 30. In the embodiment shown in FIG. 5 both the gate tracks 12, 13, 14, 15 and the source-sense tracks 16, 17 are arranged between the intermediate load tracks 4 and the inner load track 3. Other embodiments are possible where the gate tracks and source-sense tracks lie between other load tracks.

The terminals 102 are connected to the AC power terminals 20, 21 respectively and allow additional access by driving circuitry to the AC power tracks, where needed.

The use of multiple terminals for gate and/or source sense connections allows the use of split driver equipment for driving the module. In this way different voltages or timings may be used to drive different groups of semiconductor switches.

Figure 6:
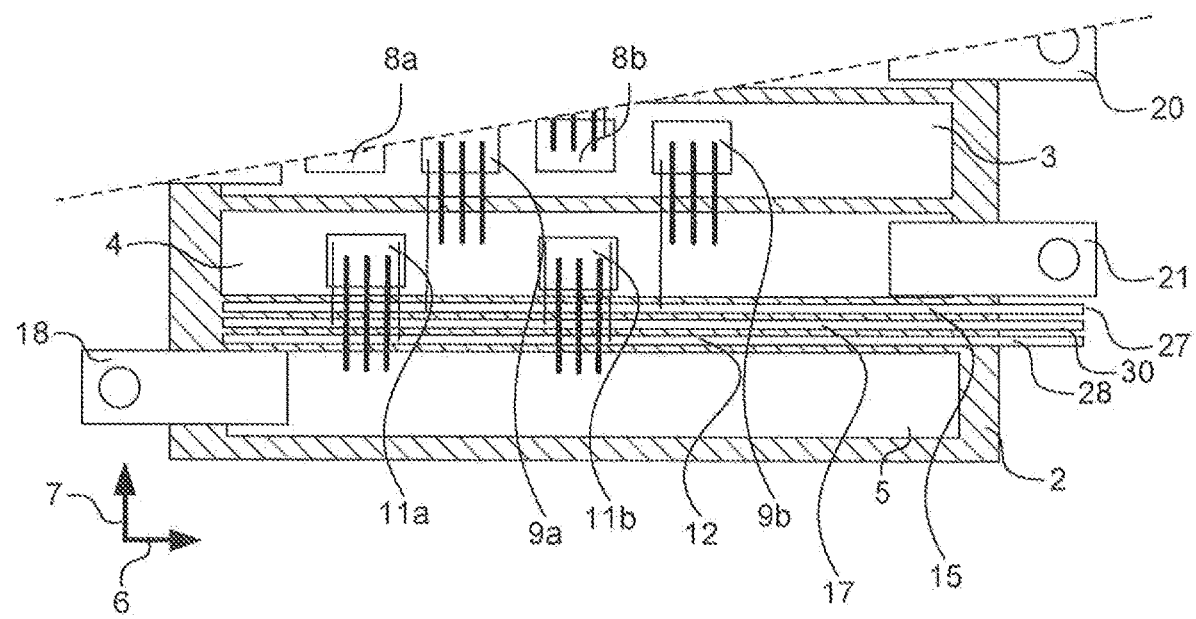
FIG. 6 shows a plan view of another embodiment of the substrate of the inventive power module 1.

FIG. 6 illustrates yet another embodiment of the substrate of the inventive power module 1. Only half of the full substrate is shown, since the other half is substantially symmetric. Here the layout of the load tracks 3, 4, 5 is similar to that shown in FIG. 2, but gate tracks 12, 15 and source-sense track 17 are also shown. The gate tracks 12, 15 are connected to gate terminals 27, 28. The source-sense track 17 is connected to the source-sense terminal 30. In the embodiment shown in FIG. 6 both the gate tracks 12, 15 and the source-sense track 17 are arranged between the intermediate load tracks 4 and the outer load track 5.

Figure 7:
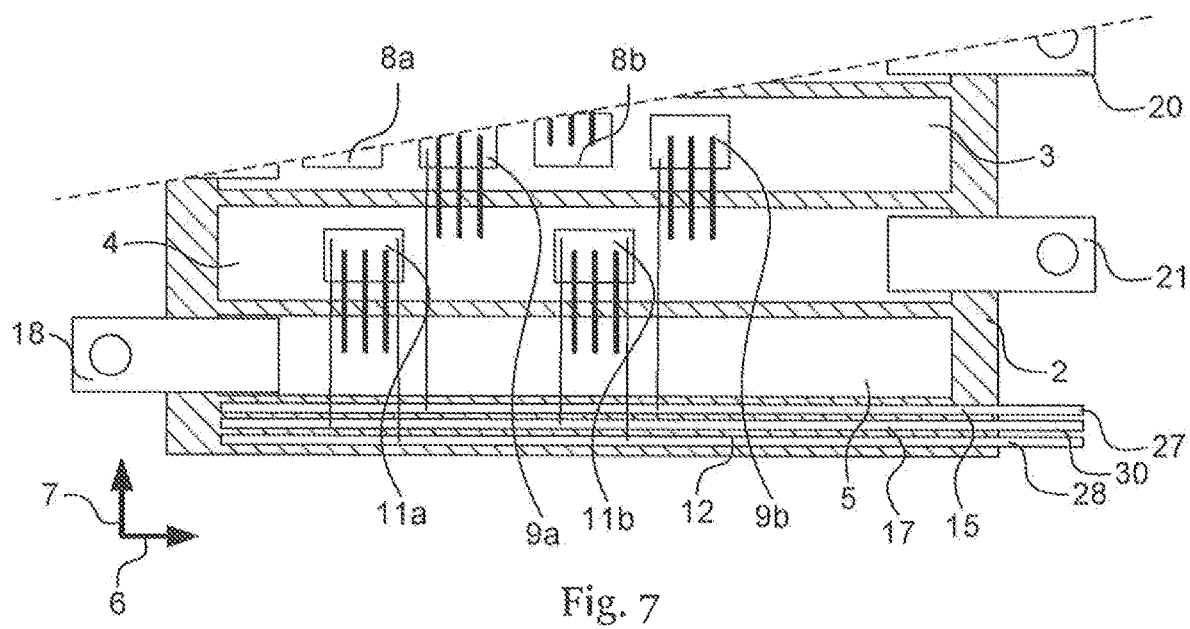
FIG. 7 shows a plan view of another embodiment of the substrate of the inventive power module 1.

FIG. 7 illustrates yet another embodiment of the substrate of the inventive power module 1. Only half of the full substrate is shown, since the other half is substantially symmetric. Here the layout of the load tracks 3, 4, 5 is similar to that shown in FIG. 2, but gate tracks 12, 15 and source-sense track 17 are also shown. The gate tracks 12, 15 are connected to gate terminals 27, 28. The source-sense track 17 is connected to the source-sense terminal 30. In the embodiment shown in FIG. 7 both the gate tracks 12, 15 and the source-sense track 17 are arranged between the outer load track 5 and the edge of the substrate 2.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power module providing a half bridge, the power module comprising:
   at least one substrate comprising an inner load track, two intermediate load tracks and two outer load tracks, each of which load tracks is elongated and extends substantially across the at least one substrate in a first direction;
   wherein the two intermediate load tracks are arranged adjacent to the inner load track, and each outer load track is arranged on the opposite side of one of the two intermediate load tracks with respect to a second direction substantially orthogonal to the first direction;

wherein the power module comprises two first sets of semiconductor switches, each first set of semiconductor switches being mounted on the inner load track and electrically connected to an intermediate load track, such that the first sets of semiconductor switches form a first arm of the half bridge;

wherein the power module comprises two second sets of semiconductor switches, each second set of semiconductor switches being mounted on an intermediate load track and electrically connected to an outer load track, such that the second sets of semiconductor switches form a second arm of the half bridge.

2. The power module according to claim 1, wherein gate connections to the semiconductor switches comprising the first and second set of semiconductor switches are made via gate tracks arranged between the intermediate load tracks and the inner load track.

3. The power module according to claim 2, wherein the gate tracks extend substantially across the at least one substrate in the first direction.

4. The power module according to claim 2, wherein source-sense connections to the semiconductor switches comprising the first and second set of semiconductor switches are made from source-sense tracks arranged between the intermediate load tracks and the inner load track.

5. The power module according to claim 2, wherein source-sense connections to the semiconductor switches comprising the first and second set of semiconductor switches are made via source-sense tracks arranged between the intermediate load tracks and the outer load tracks.

6. The power module according to claim 1, wherein gate connections to the semiconductor switches comprising the first and second set of semiconductor switches are made via gate tracks arranged between the intermediate load tracks and the outer load tracks.

7. The power module according to claim 6, wherein the gate tracks extend substantially across the at least one substrate in the first direction.

8. The power module according to claim 6, wherein source-sense connections to the semiconductor switches comprising the first and second set of semiconductor switches are made from source-sense tracks arranged between the intermediate load tracks and the inner load track.

9. The power module according to claim 1, wherein gate connections to the semiconductor switches comprising the first and second set of semiconductor switches are made via gate tracks arranged on the opposite side of the outer load tracks to the intermediate load tracks.

10. The power module according to claim 9, wherein the gate tracks extend substantially across the at least one substrate in the first direction.

11. The power module according to claim 9, wherein source-sense connections to the semiconductor switches comprising the first and second set of semiconductor switches are made from source-sense tracks arranged between the intermediate load tracks and the inner load track.

12. The power module according to claim 1, wherein gate tracks extend substantially across the at least one substrate in the first direction.

13. The power module according to claim 12, wherein source-sense connections to the semiconductor switches comprising the first and second set of semiconductor switches are made from source-sense tracks arranged between the intermediate load tracks and the inner load track.

14. The power module according to claim 1, wherein source-sense connections to the semiconductor switches comprising the first and second set of semiconductor switches are made from source-sense tracks arranged between the intermediate load tracks and the inner load track.

15. The power module according to claim 1, wherein source-sense connections to the semiconductor switches comprising the first and second set of semiconductor switches are made via source-sense tracks arranged between the intermediate load tracks and the outer load tracks.

16. The power module according to claim 1, wherein source-sense connections to the semiconductor switches comprising the first and second set of semiconductor switches are made via source-sense tracks arranged on the opposite side of the outer load tracks to the intermediate load tracks.

17. The power module according to claim 1, wherein source-sense tracks extend substantially across the at least one substrate in the first direction.

18. The power module according to claim 1, wherein external DC power terminals are arranged at one end of the module in the first direction, and one or more AC power terminals are arranged at the opposite end of the module in the first direction.

19. The power module according to claim 1, wherein one or more gate connections and/or source-sense connections are electrically connected to terminals placed on the external surface of the power module, extending substantially orthogonally to the plane of the substrate.

20. The power module according to claim 1, wherein source-sense connections to the semiconductor switches comprising the first and second set of semiconductor switches are made via source-sense tracks arranged between the intermediate load tracks and the outer load tracks.

* * * * *